(12) United States Patent
Liu et al.

(10) Patent No.: US 11,183,436 B2
(45) Date of Patent: Nov. 23, 2021

(54) POWER MODULE PACKAGE AND PACKAGING TECHNIQUES

(71) Applicant: Allegro MicroSystems, LLC, Manchester, NH (US)

(72) Inventors: Shixi Louis Liu, Hooksett, NH (US); Natasha Healey, Bedford, NH (US); Rishikesh Nikam, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 124 days.

(21) Appl. No.: 16/746,275

(22) Filed: Jan. 17, 2020

(65) Prior Publication Data
US 2021/0225721 A1 Jul. 22, 2021

(51) Int. Cl.
*H01L 23/495* (2006.01)
*H01L 23/31* (2006.01)
*H01L 27/07* (2006.01)

(52) U.S. Cl.
CPC .... *H01L 23/3107* (2013.01); *H01L 23/49524* (2013.01); *H01L 23/49568* (2013.01); *H01L 27/0727* (2013.01)

(58) Field of Classification Search
CPC .......... H01L 23/3107; H01L 23/49524; H01L 23/49568; H01L 27/0727
(Continued)

(56) References Cited

U.S. PATENT DOCUMENTS 6,072,231 A * 6/2000 Murakami .......... H01L 23/3107
257/666
6,630,726 B1 * 10/2003 Crowley ............. H01L 23/3107
257/666
(Continued)

FOREIGN PATENT DOCUMENTS

EP 2 500 939 9/2012

OTHER PUBLICATIONS

PCT Search Report and Written Opinion dated Apr. 23, 2021 for PCT Application No. PCT/US2020/065949; 15 pages.
(Continued)

*Primary Examiner* — Nitin Parekh
(74) *Attorney, Agent, or Firm* — Daly, Crowley, Mofford & Durkee, LLP

(57) ABSTRACT

A power integrated circuit (IC) includes a lead frame comprising a signal lead, a power lead, and a paddle attached to one or more of the signal lead and the power lead, an electrical component supported by the paddle, and a mold material configured to enclose a portion of the lead frame and expose a surface of the paddle, wherein the power lead has a first portion extending from an edge of the mold material outside of the mold material in a first direction and a second portion enclosed by the mold material and extending from the edge of the mold material inside the mold material in a second direction to the paddle, wherein the second direction is substantially opposite to the first direction. In embodiments, the paddle is only attached to the second portion of the power lead. The first and second portions of the power lead meet at a junction between a first portion of the mold material and a second portion of the mold material, the junction positioned on a side surface of the mold material that extends from a first surface to a substantially parallel second surface of the mold material.

42 Claims, 9 Drawing Sheets

(58) Field of Classification Search
USPC .................................. 257/666, 676, 675
See application file for complete search history.

(56) References Cited

U.S. PATENT DOCUMENTS

| | | | |
|---|---|---|---|
| 7,709,754 B2 | 5/2010 | Doogue et al. | |
| 7,768,083 B2 | 8/2010 | Doogue et al. | |
| 8,422,243 B2* | 4/2013 | Chow | H01L 24/83 |
| | | | 361/760 |
| 8,749,977 B2 | 6/2014 | Asada et al. | |
| 9,190,606 B2 | 11/2015 | Liu et al. | |
| 9,228,860 B2 | 1/2016 | Sharma et al. | |
| 9,411,025 B2 | 8/2016 | David et al. | |
| 9,494,660 B2 | 11/2016 | David et al. | |
| 9,666,788 B2 | 5/2017 | Taylor et al. | |
| 9,704,789 B1 | 7/2017 | Suh et al. | |
| 9,716,057 B1 | 7/2017 | Zhang et al. | |
| 9,812,588 B2 | 11/2017 | Vig et al. | |
| 10,234,513 B2 | 3/2019 | Vig et al. | |
| 10,345,343 B2 | 7/2019 | Milano et al. | |
| 10,481,181 B2 | 11/2019 | Bussing et al. | |
| 2004/0080028 A1* | 4/2004 | Yanagisawa | H01L 23/3107 |
| | | | 257/675 |
| 2007/0284720 A1 | 12/2007 | Otremba et al. | |
| 2008/0211068 A1* | 9/2008 | Chen | H01L 23/3107 |
| | | | 257/666 |
| 2009/0127677 A1 | 5/2009 | Gomez | |
| 2010/0164078 A1* | 7/2010 | Madrid | H01L 24/40 |
| | | | 257/675 |
| 2010/0253435 A1* | 10/2010 | Ichitsubo | H01L 25/18 |
| | | | 330/295 |
| 2012/0104588 A1* | 5/2012 | Chen | H01L 24/14 |
| | | | 257/676 |
| 2014/0036471 A1* | 2/2014 | Yuen | H05K 7/02 |
| | | | 361/813 |
| 2014/0131843 A1 | 5/2014 | Balakrishnan et al. | |
| 2014/0133186 A1 | 5/2014 | Balakrishnan et al. | |
| 2016/0233149 A1 | 8/2016 | Otremba et al. | |
| 2016/0377689 A1 | 12/2016 | Babulano et al. | |
| 2017/0179009 A1* | 6/2017 | Otremba | H01L 23/49555 |
| 2017/0229383 A1* | 8/2017 | Fernando | H01L 23/49562 |
| 2018/0061745 A1* | 3/2018 | Otremba | H01L 23/49555 |
| 2019/0157177 A1 | 5/2019 | Ichimura | |

OTHER PUBLICATIONS

U.S. Appl. No. 16/884,311, filed May 27, 2020, Liu, et al.
Allegro MicroSystems, LLC datasheet A6214 and A6216 "Automotive-Grade, Constant-Current 2 A PWM Dimmable Buck Regulator LED Driver", Nov. 1, 2016; 25 pages.
Notice of Allowance dated Aug. 18, 2021 for U.S. Appl. No. 16/884,311; 14 pages.

* cited by examiner

POWER MODULE PACKAGE AND PACKAGING TECHNIQUES

CROSS-REFERENCE TO RELATED APPLICATIONS

Not Applicable.

STATEMENT REGARDING FEDERALLY SPONSORED RESEARCH

Not Applicable.

FIELD

This invention relates generally to an integrated power module and more particularly to packaging techniques for an integrated power module.

BACKGROUND

As is known, electronic power components and signal processing circuitry are often integrated into an integrated circuit (IC), power IC, or power module, for use in a variety of applications. For example, power transistors, such as Metal Oxide Semiconductor Field Effect Transistors (MOS-FETs), are often interconnected to form of a bridge circuit, such as an H-bridge or half of an H-bridge, for motor applications. One example application is in an automotive power steering module. Integrating power components into an IC or module can present challenges including dissipating heat generated by the power components and providing complex circuitry while at the same time reducing the overall package size.

SUMMARY

According to the disclosure, a power integrated circuit (IC) includes a lead frame, an electrical component, and a mold material. The lead frame can include a signal lead, a power lead, and a paddle attached to one or more of the signal lead and the power lead and the electrical component can be supported by the paddle. The mold material can be configured to enclose a portion of the lead frame and expose a surface of the paddle. The power lead has a first portion extending from an edge of the mold material outside of the mold material in a first direction and a second portion enclosed by the mold material and extending from the edge of the mold material inside the mold material in a second direction to the paddle, wherein the second direction is substantially opposite to the first direction.

Features may include one or more of the following individually or in combination with other features. The lead frame can further include a dummy lead and the paddle can be attached to one or more of the signal lead, the power lead, and the dummy lead. The paddle can be only attached to the second portion of the power lead. The mold material has a first surface, a second surface parallel to the first surface, and a side surface extending between the first surface and the second surface and the first and second portions of the power lead can meet at a junction between a first portion of the mold material and a second portion of the mold material positioned along the side surface. In embodiments, the junction is located at a height of approximately one-fifth to one-third of a height of the side surface of the mold material. The junction can be located at a height of approximately one-fourth of a height of the side surface of the mold material. At least one of the signal lead and the power lead can have a recessed portion enclosed by the mold material and configured to lock the at least one lead into a fixed position relative to the exposed surface of the mold material. In embodiments, the recessed portion of the at least one lead can be formed by etching, stamping, coining, or laser cutting. The mold material forms an IC package having first and second opposing edges from which the signal lead and the power lead extend and having third and fourth opposing edges orthogonal to the first and second opposing edges, wherein the lead frame comprises at least one tie bar extending from one of the first or second opposing edges. The exposed surface of the paddle is configured to couple to a heatsink configured to extend beyond a surface of the mold material. At least one passive component can be coupled between at least two signal leads and enclosed by the mold material. The passive component comprises one or more of a resistor, a capacitor, an inductor, a thermistor, or a diode. The lead frame can include a plurality of signal leads, a plurality of power leads, and a plurality of paddles each attached to a respective one of the plurality of power leads or the plurality of signal leads, wherein the electrical component comprises a plurality of Field Effect Transistors (FETs) each supported by a respective paddle and electrically coupled to form a half H-bridge. At least one of the FETs can include a source terminal located external to the mold material and accessible at one of the plurality of signal leads. A wire bond can extend from the one of the signal leads to the one of the paddles by which the at least one FET is supported. In embodiments, a shunt can be coupled between the signal lead, the power lead, and the paddle. In embodiments, a jumper can be coupled in series with the power lead. The signal lead can have a first width at an end configured for external coupling and a second width larger than the first width at a bend.

Also described is a power integrated circuit (IC) including a lead frame comprising a signal lead, a power lead, and a paddle attached to one or more of the signal lead and the power lead, an electrical component supported by the paddle, and a mold material. The mold material has a first surface, a second parallel surface, and a side surface between the first and second surfaces. The mold material includes a first mold portion including the first surface and a second mold portion including the second surface and the first and second mold portions meet at a junction on the side surface of the mold material. The mold material is configured to enclose a portion of the lead frame and expose a surface of the paddle, which exposed surface is substantially coplanar with a respect to the second surface of the mold material. The power lead has a first portion extending from the junction in a first direction toward the first surface of the mold material and a second portion enclosed by the mold material and extending from the junction inside the mold material in a second direction toward the second surface of the mold material.

Features may include one or more of the following individually or in combination with other features. The junction can be located at a height of approximately one-fifth to one-third of a height of the side surface of the mold material and in some embodiments is located at a height of approximately one-fourth of the height of the side surface of the mold material. The exposed surface of the paddle can be configured to attach to a heatsink configured to extend beyond the second surface of the mold material.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1A:
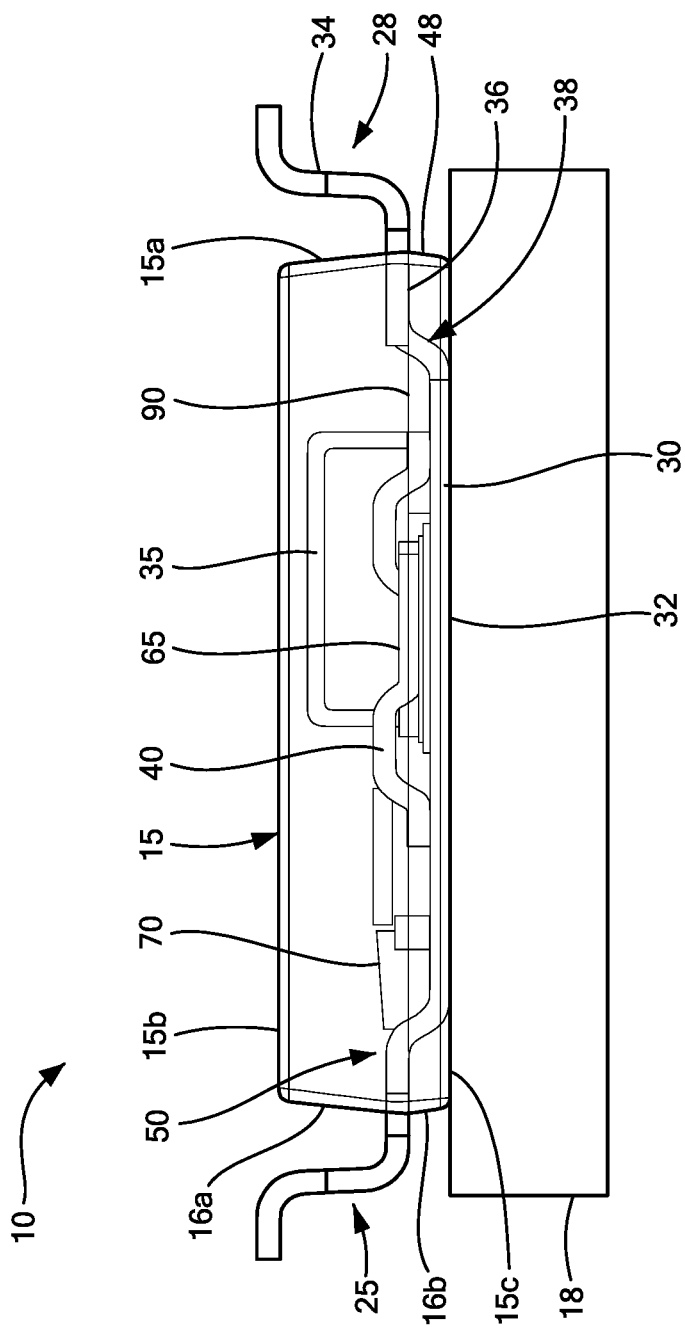
FIG. 1A is a side view of a power module according to the disclosure and including a shunt.
Figure 1B:
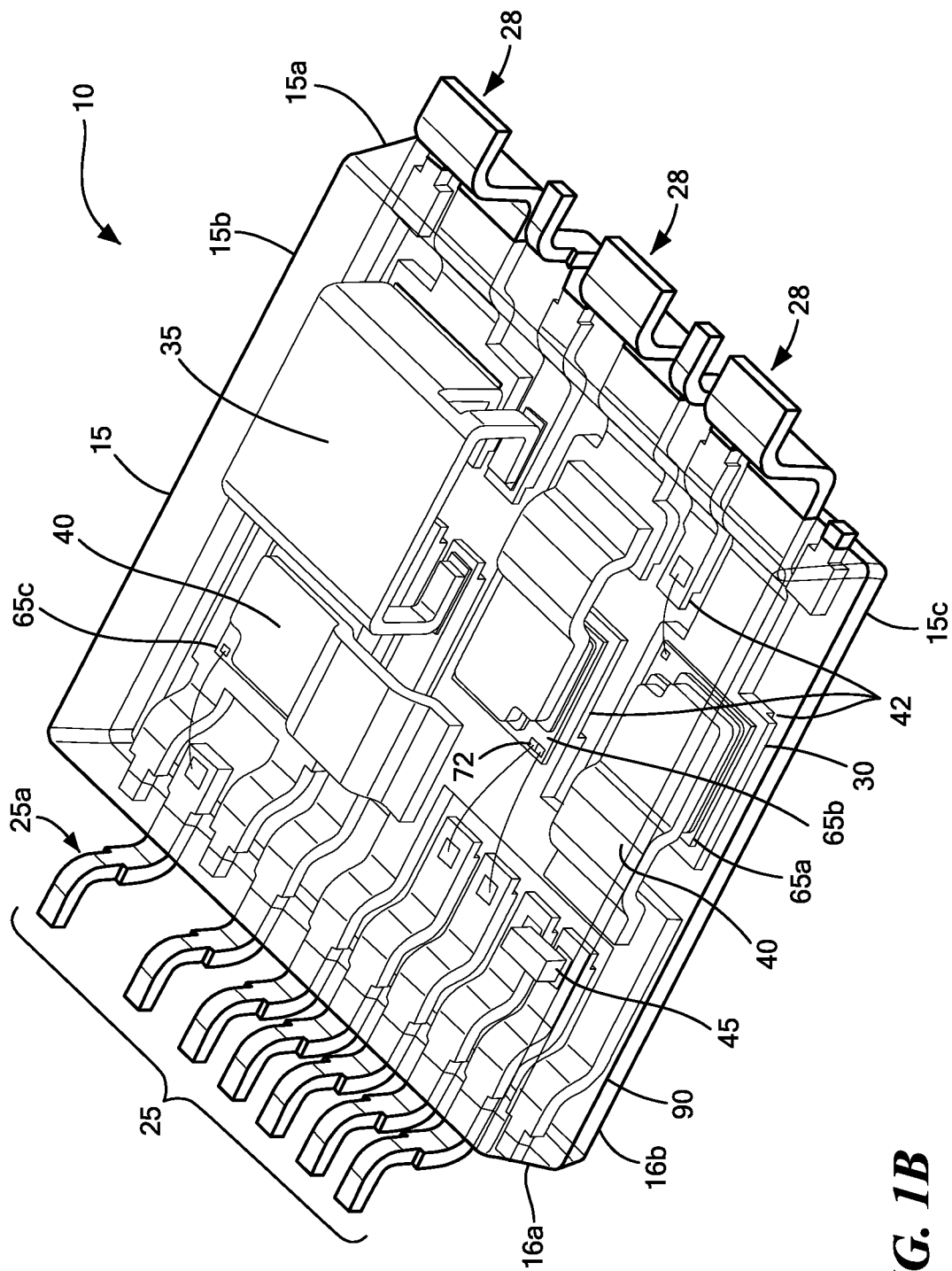
FIG. 1B is an isometric view of the power module of FIG. 1A.
Figure 1C:
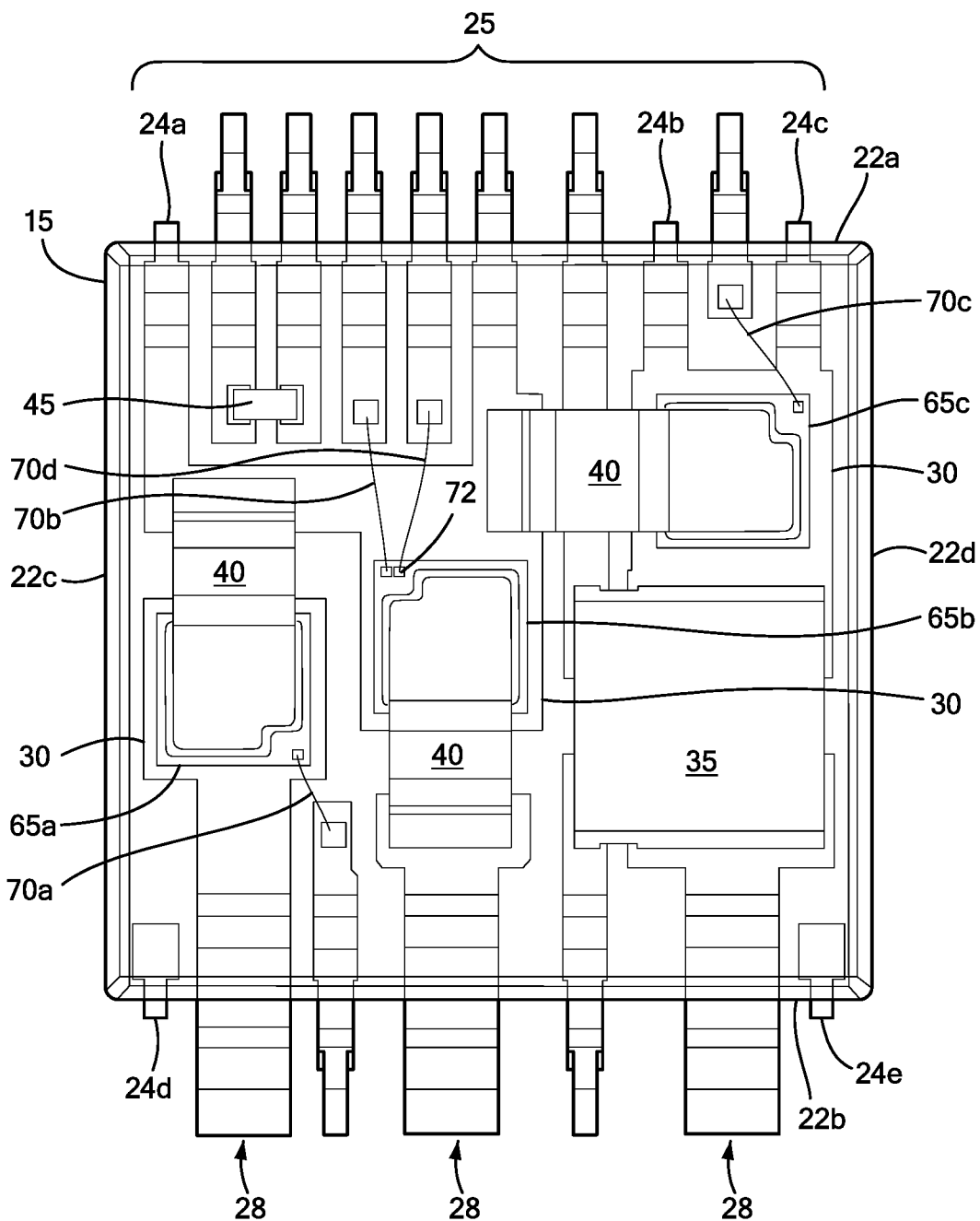
FIG. 1C is a plan view of the power module of FIG. 1A.

Referring to FIGS. 1A, 1B, and 1C, a power module 10 includes a lead frame 50, one or more electrical components 65, and a mold material 15 enclosing the electrical component. The lead frame 50 includes at least one signal lead 25, at least one power lead 28, and a paddle 30 attached to one or more of the signal lead and the power lead. The electrical component 65 is supported by the paddle 30. Internal to the module, electrical connection between leads and electrical components can be made in various ways, such as by clips 40 and/or by wire bonds 70.

According to an aspect of the disclosure, the mold material 15 is configured to enclose a portion of the lead frame 50 and expose a surface 32 of the paddle 30 such that power lead 28 has a first portion 34 extending from an edge, or side surface 15a of the mold material outside of the mold material in a first direction (i.e., generally upward in the view of FIG. 1A) and a second portion 36 enclosed by the mold material 15 and extending from the edge of the mold material inside the mold material in a second direction (i.e., generally downward the view of FIG. 1A) to the paddle 30, wherein the second direction is substantially opposite to the first direction. The first and second directions in which the power lead portions 34, 36 extend can be substantially vertical with respect to the module 10 as illustrated.

Mold material 15 can be considered to form a package 15 from which the second portion 36 of the leads extend to permit electrical connection to other circuits and systems (not shown). Leads 25, 28 are surface mount leads configured to be attached to bond pads of a printed circuit board or other suitable substrate in use. It will be appreciated that in use, the module 10 can be inverted with respect to the view of FIGS. 1A-1C and mounted with the orientation shown in the view of FIG. 3B.

The first and second portions 34, 36 of the power lead 28 can be considered to meet at a junction 48. The exposed paddle surface 32 can be referred to as a down set paddle portion or surface. The lead 28 has a jog 38 between the junction 48 and the down set paddle surface 32, as shown. In embodiments, the down set height (jog height) can have a minimum dimension on the order of 1.0 mm. Mold material 15 has a first surface 15b and a second surface 15c parallel to the first surface and side surface 15a extends from the first surface 15b to the second surface 15c.

With this arrangement of the first power lead portion 34 extending in a different, substantially vertical direction than the second power lead portion 36, which second power lead portion extends to the down set exposed surface 32 of the paddle 30, a heatsink (or other direct contact heat conduction cooling system) 18 attached to the exposed paddle surface 32 can be larger than otherwise possible. This is because the heatsink 18 can extend horizontally beyond the leads 25, 28. This arrangement presents a flat, planar surface for heat sink mounting and thus eliminates restrictions on design of heat sink 18 for the module. By contrast, in conventional configurations in which the leads extend outside of the package in the same direction as the down set paddle surface 32, the heatsink is confined to a width generally no larger than the width of the mold material 15.

Figure 3A:
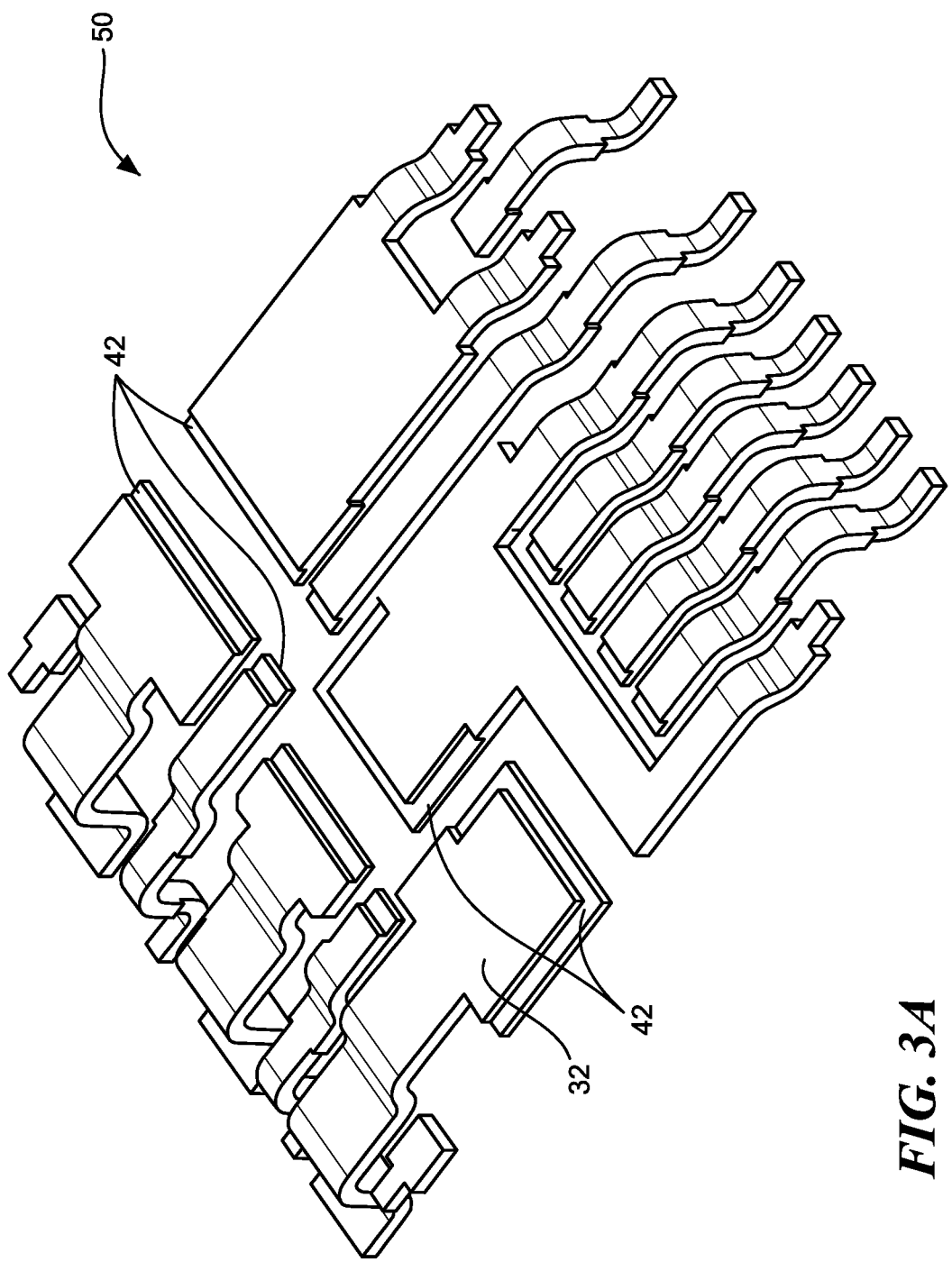
FIG. 3A is an isometric view of a lead fame of the power modules of FIGS. 1A-1C and 2A-2C.
Figure 3B:
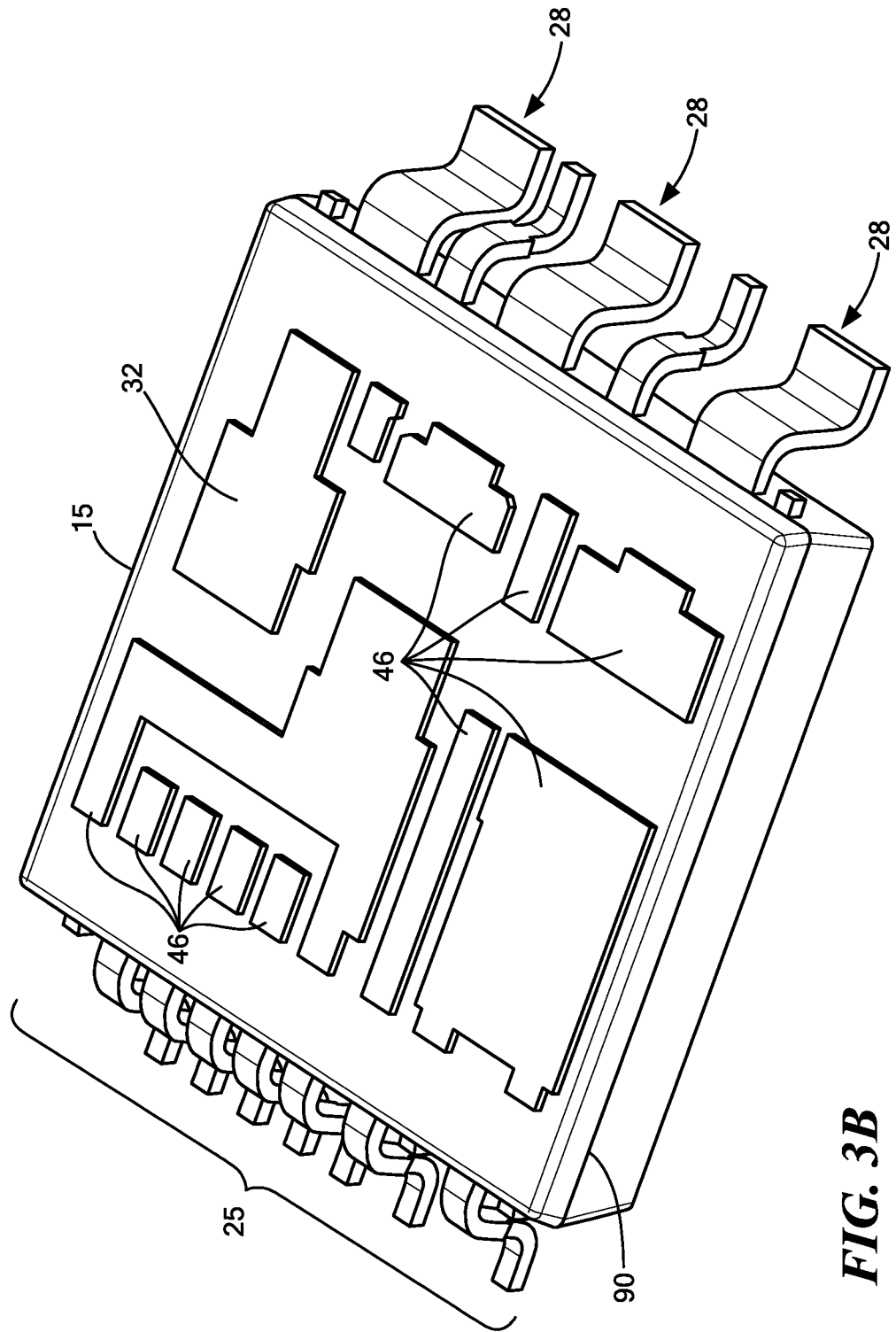
FIG. 3B is an isometric view of the lead frame of FIG. 3A after overmolding and plating.

Referring also to FIG. 3A, lead frame 50 is shown in an orientation inverted with respect to FIGS. 1A-1C. FIG. 3B shows the module 10 overmolded by mold material 15. From these views, down set exposed paddle surface 32 can be seen. While lead features are explained in connection with power lead 28 to include portions 34, 36 meeting at junction 48, paddle 30 with down set exposed surface 32, jog 38, etc., it will be appreciated that other leads (other power leads 28 and/or signal leads 25) can have similar features. In general, the down set area of some leads includes a paddle 30 supporting an electrical component and the down set area of other leads includes a bond pad for internal connection by a clip 40 or wire bond 70. Further, the down set area of still other leads may or may not be internally coupled in which case such "dummy leads" can form tie bars as will be explained. In general, as illustrated in FIG. 3B, the down set area of the leads 25, 28 has an exposed surface (collectively labeled 46) in order to facilitate heat removal.

According to a further aspect, at least one signal lead 25 and/or power lead 28 has a recessed, or thinned portion 42 enclosed by the mold material 15 and configured to securely lock the respective lead into a fixed position relative to the mold material. The recessed portion 42 can be seen at various locations in the view of FIG. 1B and FIG. 3A as labelled 42. Recessed portions 42 can be formed by various techniques including, but not limited to etching (by either wet etch or dry etch), stamping, coining or laser cutting. Formation of the recessed portion can reduce a thickness of the respective lead by about 40% to 60% and in some embodiments by about 50%. The mold material 15 engages the recessed portions 42 to form a locking mechanism by which the leads are firmly and fixedly held in place with respect to the mold material. Suitable materials for the mold material 15 include thermoset and thermoplastic mold compounds and other commercially available IC mold compounds. In some embodiments, a recessed portion 42 is provided for those leads having a down set area with an exposed surface or having a down set paddle with an exposed surface, as shown in FIG. 3A.

An example circuit formed by the components within the module 10 is shown and described in connection with FIG. 4. Suffice it to say here that integrated electrical component 65 can take various forms, such as a MOSFET. Here, power module 10 is shown to include three FETs 65a, 65b, 65c, each supported by a separate substrate or semiconductor die. Thus, power module 10 can be referred to interchangeably as a multi-chip module. It will be appreciated that in some embodiments, more than one component 65a-65c and in some cases all of the components 65a, 65b, 65c can be supported by a single die. In such embodiments where all of the power components are supported by a single die, the packaged device 10 may be referred to as a power IC rather than a power module. However, more generally, power IC and power module are used interchangeably.

Each FET supporting die is in turn attached to a respective paddle 30. Various materials and techniques can be used to attach the die to the paddles, such as by soldering or with the use of an epoxy (either conductive or non-conductive epoxy may be used depending on the need) or an adhesive tape or sintered silver.

In addition to power components 65a-65c, one or more passive components 45 can be coupled between at least two signal leads within the package 15. For example, a thermistor 45 can be coupled between signal leads 25, as shown. Thermistor 45 can monitor the internal temperature of the module and provide temperature information to an external controller. Other example passive components that can be integrated in a similar fashion include but are not limited to a resistor, a capacitor, inductor, a thermistor, or a diode.

Another example electrical component can be provided in the form of a shunt resistor, or simply shunt 35. Shunt 35 can be coupled between a power lead 28, a signal lead 25, and a paddle as shown.

Passive component 45 and shunt 35 can be attached to the down set area of one or more respective leads by soldering to one or more bond pads or with a conductive epoxy process as examples.

In general, signal leads 25 differ from power leads 28 in the types of signals carried, with power leads generally carrying higher power signals than signal leads. Accordingly, signal leads 25 tend to be smaller in width than power leads 28 as shown. In embodiments, a width of one or more signal leads 25 can be enlarged at a bend area 25a (FIG. 1B) of the lead in order to improve the lead's coplanarity, and positioning of leads with respect to mold body 15.

According to a further aspect, one or more paddles 30 is only attached to the second portion 36 of the power lead (i.e., is only attached on one side) such that the paddle is cantilevered as shown. Stated differently, the down set paddle surface 32 can be described as a one-sided down set. With this arrangement, stress that could otherwise occur due to the deep down set of the relatively thick lead frame is avoided and the required electrical isolation between the signal leads and power leads is achieved.

As shown in the plan view of FIG. 1C, package 15 has first and second opposing edges 22a, 22b from which the signal leads 25 and the power leads 28 extend, respectively, and further has third and fourth opposing edges 22c, 22d orthogonal to the first and second opposing edges. According to a further aspect, lead frame 50 includes at least one tie bar 24 (and here five tie bars 24a, 24b, 24c, 24d, and 24e) extending from one of the first or second opposing edges 22a, 22b, as shown. Tie bars 24 hold the molded package during lead forming process.

As is apparent, the bars 24a-24e may or may not be connected within the module 10. For example, tie bar 24a is electrically connected to electrical component 65a and tie bars 24b and 24c are electrically connected to electrical component 65c. Tie bars 24d and 24e however are not connected within the package 15 and thus, can be referred to as dummy leads or dummy tie bars. It will be appreciated that a paddle can be attached to a dummy lead (in addition to or instead of being attached one or more of a signal lead and a power lead).

With this arrangement of having tie bars that extend only from the package edges 22a, 22b from which the leads extend (rather than also or alternatively having tie bars extending from orthogonal packages edges 22c, 22d), the lead frame density is increased. Stated differently, the number of lead frame units that can be provided by the same area of lead frame metal is increased since "side protrusions" are avoided.

The junction 48 between the first lead portion 34 and the second lead portion 36 (i.e., the location at which the lead 28 exits the package 15 and thus the location where the first lead portion 34 starts and second lead portion 36 ends or vice versa) can be located at a parting, or separation line 90 (FIG. 3B) in the mold material 15 between a first mold portion 16a and a second mold portion 16b. In embodiments, the junction 48 is located at a height of approximately one-fifth to one-third of a height of the side surface 15a of the mold material 15, for example, the junction 48 can be located at a height of approximately one-fourth of the height of the side surface 15a of the mold material 15.

With this arrangement of the lead 28 exiting the package 15 at the separation line 90 between the first and second mold portions 16a, 16b, a mechanical advantage is achieved. In particular, this design prevents the leads from popping out of the mold material 15 and thus, provides an improved strength of retention of the leads relative to the package 15.

During manufacture, lead frame 50 is formed from a sheet or strip of metal that is patterned (e.g., stamped, etched) to provide the desired lead frame features (e.g., signal leads, power leads, and paddles) and the desired bends (e.g., jog 38, surface mount pads) in the leads. Generally, a plurality of lead frames like lead frame 50 are formed from the same metal sheet and tie bars hold together the lead frame 50 with other lead frames (not shown). Once the module 10 is formed (i.e., once the electrical component 65 is attached, internal electrical connections are made (e.g., by wire bonds or clips), and the device is overmolded by mold material 15), the module 10 is separated (i.e., singulated) from other modules (not shown) formed from the same lead frame material. The thickness of the lead frame can vary. In some embodiments the lead frame thickness is on the order of 20 mils. As one example, the manufacturing process can include attaching the FET supporting die to respective paddles 30, attaching other components to paddles (e.g., passives 45 and shunt 35), solder reflow to attach the die and other components to bond pads on the paddles, attaching clips 40, another solder reflow, and attaching wire bonds 70. The subassembly thus formed can then be overmolded with mold material 15.

Mold material 15 can be formed by a single step molding process by which the first mold portion 16a and the second mold portion 16b are formed. For example, the lead frame subassembly (i.e., lead frame 50 with components and interconnections in place) can be placed in a hollow space created by joining the two mold cavities (i.e., negatives) that can be held together by means of high-pressure hydraulic systems. Molding compound is then forced through a small opening (i.e., gate) into the cavities by a process such as injection molding, compression molding, transfer molding, or potting. After sufficient time has passed, the mold material is partially cured and then the two mold chases are separated, and the molded body is then "ejected" out of the cavities. The molded body unit is then fully cured at high temperature to improved mechanical strength of the molded body.

Figure 2A:
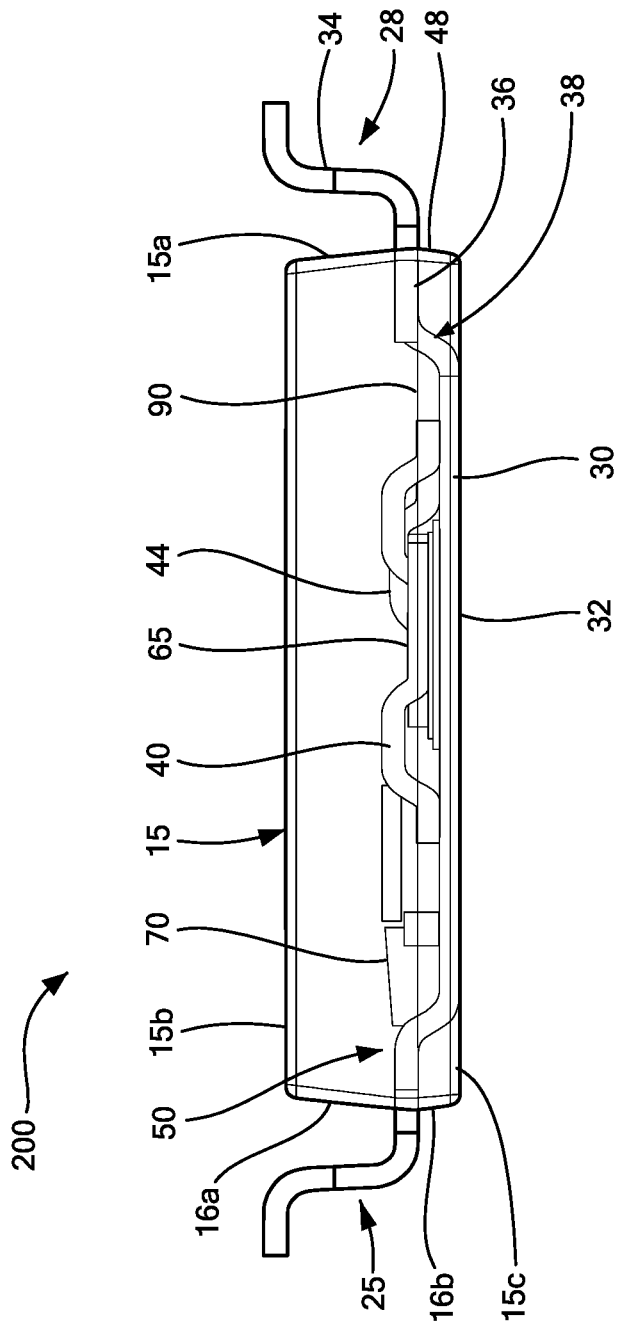
FIG. 2A is a side view of another power module according to the disclosure and including a jumper.
Figure 2B:
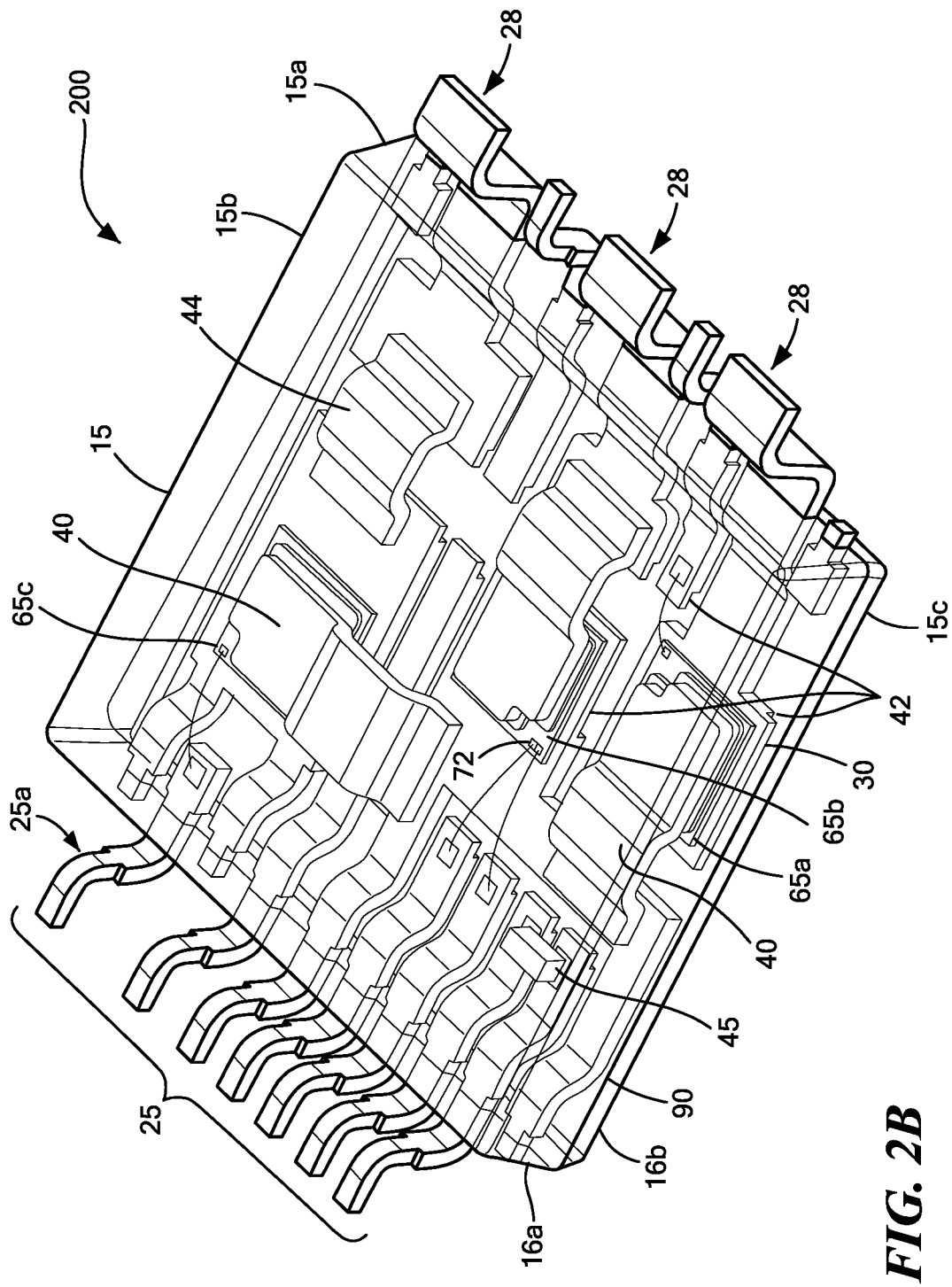
FIG. 2B is an isometric view of the power module of FIG. 2A.
Figure 2C:
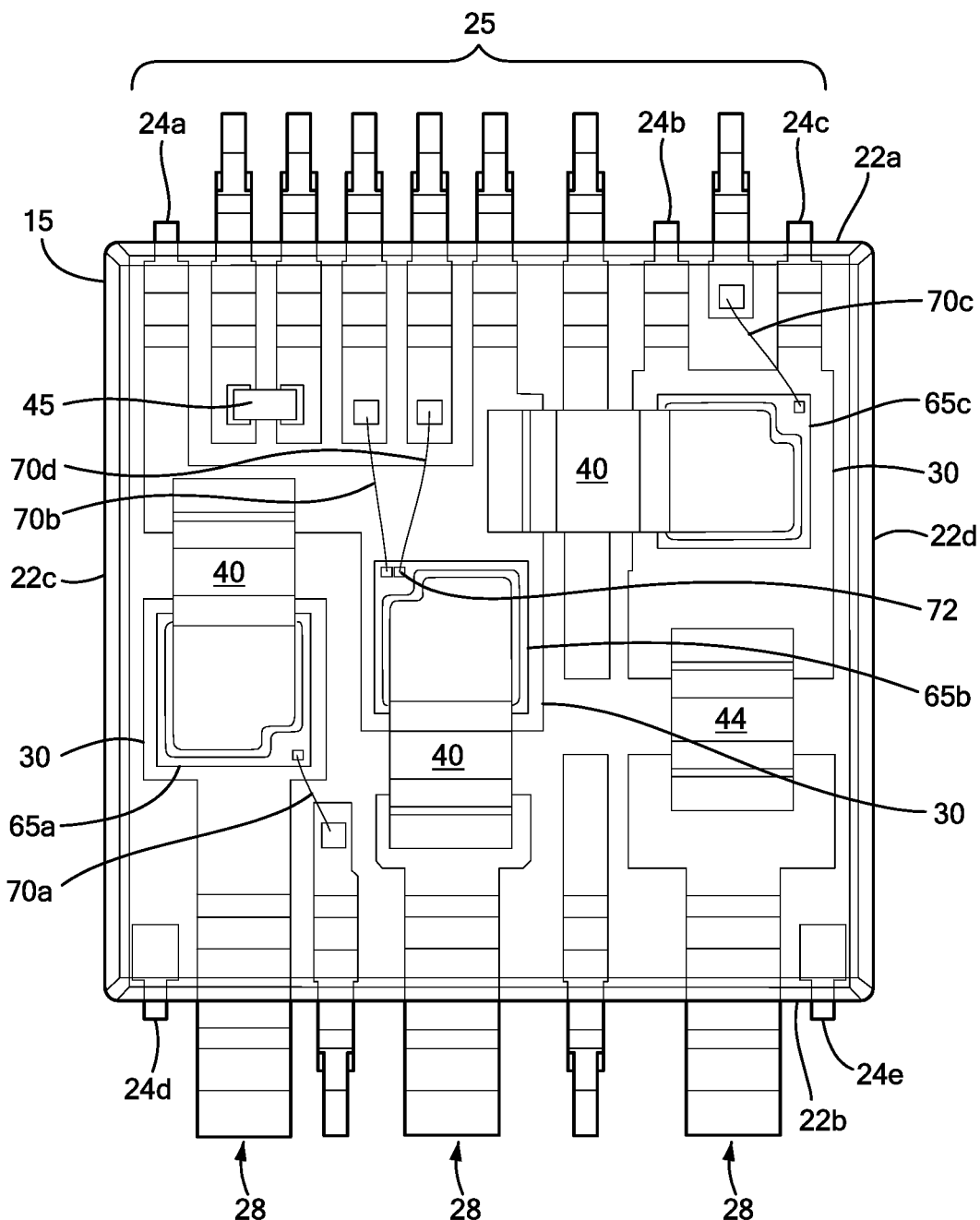
FIG. 2C is a plan view of the power module of FIG. 2A.

Referring also to FIGS. 2A, 2B, and 2C, a power module 200 is shown which is similar to the module 10 of FIGS. 1A, 1B, and 1C. Module 200 differs from module 10 only in that shunt 35 is replaced with a jumper 44. Thus, like elements with respect to FIGS. 1A, 1B, and 1C are labeled with like reference numbers.

Figure 4:
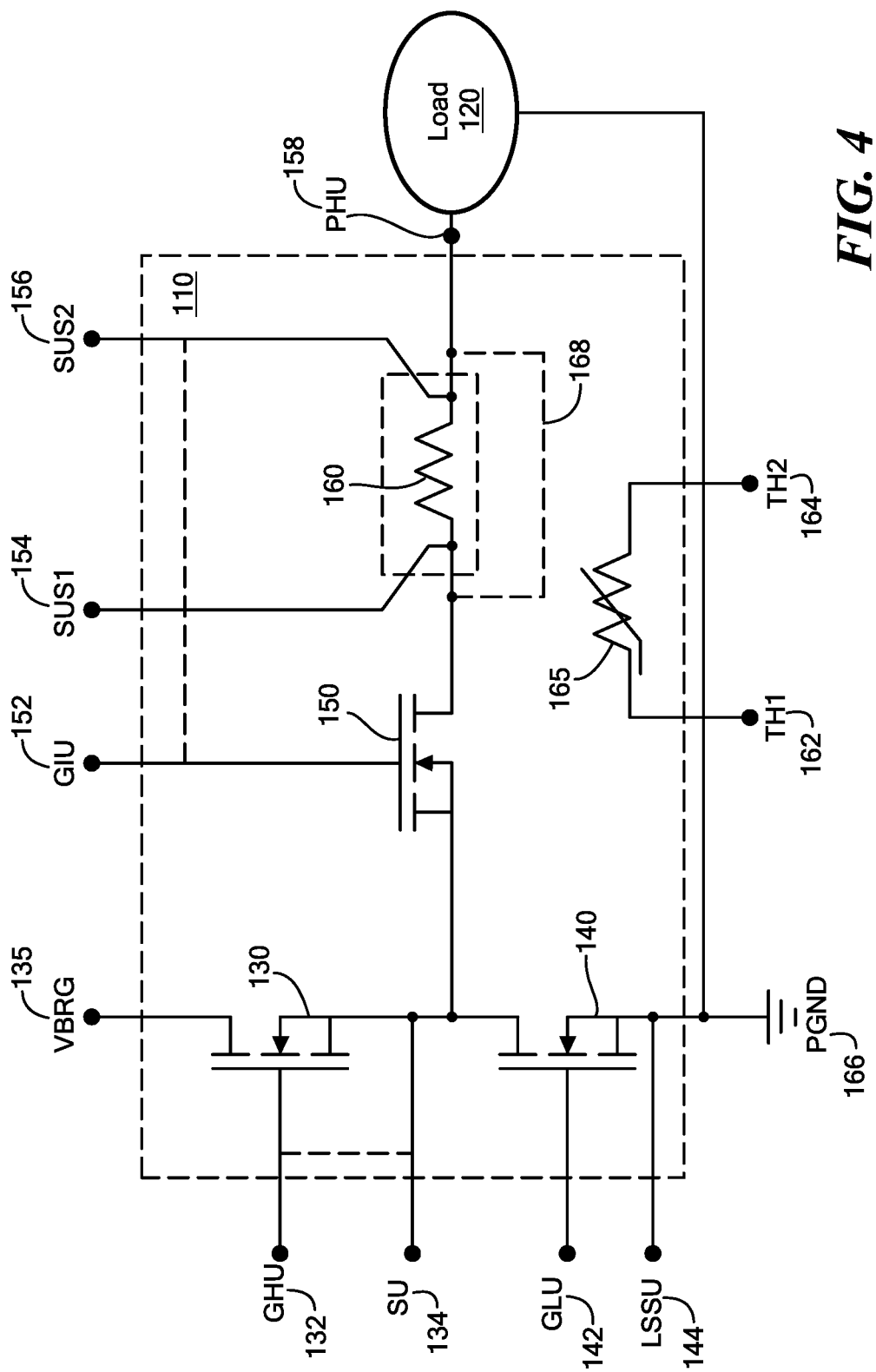
FIG. 4 is a schematic of the power modules of FIGS. 1A-1C and 2A-2C.

Referring also to FIG. 4, a schematic representation of a module 110 is shown, which module 110 can be the same as or similar to module 10 of FIGS. 1A-1C or module 200 of FIGS. 2A-2C. In order to provide the module 10 of FIGS. 1A-1C, module 110 includes a shunt resistor or simply a shunt 160 as may be the same as or similar to shunt 35 of FIGS. 1A-1C. Shunt 160 can be used to sense a load current (i.e., a motor phase current). To this end, leads SUS1 154 and SUS2 156 permit external connection to terminals of the shunt, as shown. In order to provide module 200 of FIGS. 2A-2C, module 110 includes jumper 44 (shown schematically by dotted line 168 in FIG. 4) instead of the shunt 160. Because modules 10 and 200 both can be provided by module 110 requiring just a simple change of replacing the shunt 160 with the jumper 168 or vice versa, the manufacturing expense (e.g., tooling costs) of providing modules 10 and 200 can be reduced.

Module 110 includes FETs 130, 140, and 150 that can be the same as or similar to FETs 65a, 65b, and 65c, respectively. Electrical connection points between the integrated components and external to the package are shown. FETs 130, 140, and 150 are coupled in a half bridge (or half H-bridge) configuration, as shown. Electrical connections to terminals of the FETs include lead VBRG 135 coupled to a drain terminal of FET 130, lead GHU 132 coupled to a gate terminal of FET 130, lead SU 134 coupled to a source terminal of FET 130, lead GLU 142 coupled to a gate terminal of FET 140, lead LSSU 144 coupled to a source terminal of FET 140, and lead GIU 152 coupled to a gate terminal of FET 150. Also shown in the schematic of FIG. 4 is thermistor 165 that can be the same as or similar to thermistor 45 (FIGS. 1B-1C, 2B-2C). FET 150 can be coupled to a load 120 as can take various forms depending on the application. In some embodiments, the load 120 is a motor winding. Leads VBRG 135, PHU 158, and PGND 166 can be power leads 28 and the remaining leads can be signal leads.

According to an aspect of the disclosure, at least one FET has an additional connection to its source terminal for diagnostic purposes. In particular, generally FETs require only one external connection to a gate terminal to operate. Here, FET 140 (i.e., FET 65b in FIGS. 1A-1C, 2A-2C) has an additional external connection to its source terminal provided by lead LSSU 144. Lead LSSU 144 is coupled to a source bond pad (labelled 72 in FIGS. 1B, 1C, 2B, 2C) on the FET 140 by a wire bond 70d. This arrangement is advantageous for testing purposes, such as in order to meet the high safety standards for certain types of applications such as Automotive Safety Integrity Level (ASIL) requirements. Without this extra source bond pad 72, in order to electrically connect to the source of FET 140, wire would have been bonded to a copper clip 40 which would require additional plating thus increasing design and production costs.

Internal to the module, electrical connection between leads and internal components can be made in various ways, such as by clips 40 or by wire bonds 70. For example, connection between a transistor gate terminal and a signal lead can be made by wire bonds, as labelled wire bonds 70a, 70b, and 70c in FIGS. 1C and 2C for FETs 65a, 65b, and 65c, respectively. Further, internal electrical connection to a source terminal (e.g., source terminal of transistor 140) can be made by a wire bond labeled 70d coupled to source bond pad 72 as shown in FIGS. 1C, 2C.

It will be appreciated that the particular components and circuits shown in the figures are examples and the various advantageous features described herein can be applied to other component and circuit combinations. By way of one non-limiting example, a module according to the disclosure can be provided for controlling three phases of a motor instead of a single phase as shown in FIG. 4. To this end, such a module can contain nine FETs (rather than the three illustrated in FIG. 4), with three such FETs controlling each phase of a three-phase motor.

All references cited herein are hereby incorporated herein by reference in their entirety.

Having described preferred embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A power integrated circuit (IC) comprising:
a lead frame comprising a signal lead, a power lead, a tie bar, and a paddle attached to one or more of the signal lead and the power lead;
an electrical component supported by the paddle;
a mold material configured to enclose a portion of the lead frame and expose a surface of the paddle, wherein the power lead has a first portion extending from an edge of the mold material outside of the mold material in a first direction and a second portion enclosed by the mold material and extending from the edge of the mold material inside the mold material in a second direction to the paddle, wherein the second direction is substantially opposite to the first direction; and a shunt, wherein the paddle comprises a first portion supporting the electrical component and a second portion adjacent to and spaced from the first portion, and wherein the shunt comprises a raised structure configured to be soldered between the first portion and the second portion of the paddle.

2. The power IC of claim 1 wherein the lead frame further comprises a dummy lead and wherein the paddle is further attached to one or more of the signal lead and the power lead.

3. The power IC of claim 1 wherein the paddle is attached to the tie bar in a cantilevered fashion.

4. The power IC of claim 1 wherein the mold material has a first surface, a second surface positioned parallel to the first surface, and a side surface extending from the first surface to the second surface, wherein the first and second portions of the power lead meet at a junction between a first portion of the mold material and a second portion of the mold material positioned at the side surface of the mold material.

5. The power IC of claim 4 wherein the junction is located at a height of approximately one-fifth to one-third of a height of the side surface of the mold material.

6. The power IC of claim 5 wherein the junction is located at a height of approximately one-fourth of the height of the side surface of the mold material.

7. The power IC of claim 1 wherein at least one of the signal lead and the power lead has a recessed portion enclosed by the mold material and configured to lock the at least one lead into a fixed position relative to the exposed surface of the paddle.

8. The power IC of claim 7 wherein the recessed portion of the at least one lead is formed by etching, stamping, coining, or laser cutting.

9. The power IC of claim 1 wherein the mold material forms an IC package having first and second opposing edges from which the signal lead and the power lead extend and having third and fourth opposing edges orthogonal to the first and second opposing edges, and wherein the tie bar extends from one of the first or second opposing edges and does not extend from the third or fourth opposing edges.

10. The power IC of claim 1 wherein the exposed surface of the paddle is configured to attach to a heatsink configured to extend beyond a surface of the mold material.

11. The power IC of claim 1 further comprising at least one passive component coupled between at least two signal leads and enclosed by the mold material.

12. The power IC of claim 11 wherein the passive component comprises one or more of a resistor, a capacitor, an inductor, a thermistor, or a diode.

13. The power IC of claim 1 wherein the lead frame comprises a plurality of signal leads, a plurality of power leads, and a plurality of paddles each attached to a respective one of the plurality of power leads or the plurality of signal leads, wherein the electrical component comprises a plurality of Field Effect Transistors (FETs) each supported by a respective paddle and electrically coupled to form a half H-bridge.

14. The power IC of claim 13 wherein at least one of the plurality of FETs comprises a source terminal located external to the mold material and accessible at one of the plurality of signal leads.

15. The power IC of claim 14 further comprising a wire bond extending from the one of the plurality of signal leads to a bond pad coupled to a source terminal of at least one FET.

16. The power IC of claim 1 further comprising a jumper, wherein the paddle comprises a first portion supporting the electrical component and a second portion adjacent to and spaced from the first portion, and wherein the jumper comprises a raised structure configured to be soldered between the first portion and the second portion of the paddle.

17. The power IC of claim 1 wherein the signal lead comprises a first width at an end configured for external coupling, a second width larger than the first width at a first bend external to the mold material, and a third width larger than the second width internal to the mold material.

18. A power integrated circuit (IC) comprising:
a lead frame comprising a signal lead, a power lead, a tie bar, a paddle attached to one or more of the signal lead and the power lead;
an electrical component supported by the paddle;
a mold material having a first surface, a second parallel surface, and a side surface between the first and second surfaces, wherein the mold material comprises a first mold portion including the first surface and a second mold portion including the second surface and wherein the first and second mold portions meet at a junction on the side surface of the mold material, wherein the mold material is configured to enclose a portion of the lead frame and expose a surface of the paddle, wherein the exposed surface of the paddle is substantially coplanar with a respect to the second surface of the mold material;

wherein the power lead has a first portion extending from the junction in a first direction toward the first surface of the mold material and a second portion enclosed by the mold material and extending from the junction inside the mold material in a second direction toward the second surface of the mold material; and a shunt, wherein the paddle comprises a first portion supporting the electrical component and a second portion adjacent to and spaced from the first portion, and wherein the shunt comprises a raised structure configured to be soldered between the first portion and the second portion of the paddle.

19. The power IC of claim 18 wherein the junction is located at a height of approximately one-fifth to one-third of a height of the side surface of the mold material.

20. The power IC of claim 19 wherein the junction is located at a height of approximately one-fourth of the height of the side surface of the mold material.

21. The power IC of claim 18 wherein the exposed surface of the paddle is configured to attach to a heatsink configured to extend beyond the second surface of the mold material.

22. A power integrated circuit (IC) comprising:
a lead frame comprising a signal lead, a power lead, a tie bar, and a paddle attached to one or more of the signal lead and the power lead;
an electrical component supported by the paddle;
a mold material configured to enclose a portion of the lead frame and expose a surface of the paddle, wherein the power lead has a first portion extending from an edge of the mold material outside of the mold material in a first direction and a second portion enclosed by the mold material and extending from the edge of the mold material inside the mold material in a second direction to the paddle, wherein the second direction is substantially opposite to the first direction; and
a jumper, wherein the paddle comprises a first portion supporting the electrical component and a second portion adjacent to and spaced from the first portion, and wherein the jumper comprises a raised structure configured to be soldered between the first portion and the second portion of the paddle.

23. The power IC of claim 22 wherein the lead frame further comprises a dummy lead and wherein the paddle is further attached to one or more of the signal lead and the power lead.

24. The power IC of claim 22 wherein the paddle is attached to the tie bar in a cantilevered fashion.

25. The power IC of claim 22 wherein the mold material has a first surface, a second surface positioned parallel to the first surface, and a side surface extending from the first surface to the second surface, wherein the first and second portions of the power lead meet at a junction between a first portion of the mold material and a second portion of the mold material positioned at the side surface of the mold material.

26. The power IC of claim 25 wherein the junction is located at a height of approximately one-fifth to one-third of a height of the side surface of the mold material.

27. The power IC of claim 26 wherein the junction is located at a height of approximately one-fourth of the height of the side surface of the mold material.

28. The power IC of claim 22 wherein at least one of the signal lead and the power lead has a recessed portion enclosed by the mold material and configured to lock the at least one lead into a fixed position relative to the exposed surface of the paddle.

29. The power IC of claim 28 wherein the recessed portion of the at least one lead is formed by etching, stamping, coining, or laser cutting.

30. The power IC of claim 22 wherein the mold material forms an IC package having first and second opposing edges from which the signal lead and the power lead extend and having third and fourth opposing edges orthogonal to the first and second opposing edges, and wherein the tie bar extends from one of the first or second opposing edges and does not extend from the third or fourth opposing edges.

31. The power IC of claim 22 wherein the exposed surface of the paddle is configured to attach to a heatsink configured to extend beyond a surface of the mold material.

32. The power IC of claim 22 further comprising at least one passive component coupled between at least two signal leads and enclosed by the mold material.

33. The power IC of claim 32 wherein the passive component comprises one or more of a resistor, a capacitor, an inductor, a thermistor, or a diode.

34. The power IC of claim 22 wherein the lead frame comprises a plurality of signal leads, a plurality of power leads, and a plurality of paddles each attached to a respective one of the plurality of power leads or the plurality of signal leads, wherein the electrical component comprises a plurality of Field Effect Transistors (FETs) each supported by a respective paddle and electrically coupled to form a half H-bridge.

35. The power IC of claim 34 wherein at least one of the plurality of FETs comprises a source terminal located external to the mold material and accessible at one of the plurality of signal leads.

36. The power IC of claim 35 further comprising a wire bond extending from the one of the plurality of signal leads to a bond pad coupled to a source terminal of at least one FET.

37. The power IC of claim 23 further comprising a shunt, wherein the paddle comprises a first portion supporting the electrical component and a second portion adjacent to and spaced from the first portion, and wherein the shunt comprises a raised structure configured to be soldered between the first portion and the second portion of the paddle.

38. The power IC of claim 22 wherein the signal lead comprises a first width at an end configured for external coupling, a second width larger than the first width at a first bend external to the mold material, and a third width larger than the second width internal to the mold material.

39. A power integrated circuit (IC) comprising:
a lead frame comprising a signal lead, a power lead, a tie bar, and a paddle attached to one or more of the signal lead and the power lead;
an electrical component supported by the paddle;
a mold material having a first surface, a second parallel surface, and a side surface between the first and second surfaces, wherein the mold material comprises a first mold portion including the first surface and a second mold portion including the second surface and wherein the first and second mold portions meet at a junction on the side surface of the mold material, wherein the mold material is configured to enclose a portion of the lead frame and expose a surface of the paddle, wherein the exposed surface of the paddle is substantially coplanar with a respect to the second surface of the mold material; and
a jumper, wherein the paddle comprises a first portion supporting the electrical component and a second portion adjacent to and spaced from the first portion, and wherein the jumper comprises a raised structure configured to be soldered between the first portion and the second portion of the paddle;
wherein the power lead has a first portion extending from the junction in a first direction toward the first surface of the mold material and a second portion enclosed by the mold material and extending from the junction inside the mold material in a second direction toward the second surface of the mold material.

40. The power IC of claim 39 wherein the junction is located at a height of approximately one-fifth to one-third of a height of the side surface of the mold material.

41. The power IC of claim 40 wherein the junction is located at a height of approximately one-fourth of the height of the side surface of the mold material.

42. The power IC of claim 39 wherein the exposed surface of the paddle is configured to attach to a heatsink configured to extend beyond the second surface of the mold material.

* * * * *

UNITED STATES PATENT AND TRADEMARK OFFICE
CERTIFICATE OF CORRECTION

PATENT NO. : 11,183,436 B2
APPLICATION NO. : 16/746275
DATED : November 23, 2021
INVENTOR(S) : Shixi Louis Liu et al.

It is certified that error appears in the above-identified patent and that said Letters Patent is hereby corrected as shown below:

In the Specification

Column 1, Line 27 delete "form of a" and replace with --form a--.

Column 2, Line 47 delete "with a respect" and replace with --with respect--.

Column 4, Line 12 delete "on design" and replace with --on the design--.

Column 5, Line 63 delete "attached one" and replace with --attached to one--.

Column 6, Line 1 delete "packages" and replace with --package--.

Column 6, Line 33 delete "is attached," and replace with --is attached).--.

Column 6, Line 35 delete "material 15)," and replace with --material 15,--.

In the Claims

Column 11, Line 36 delete "claim 23" and replace with --claim 22--.

Signed and Sealed this
Thirteenth Day of December, 2022

Katherine Kelly Vidal
*Director of the United States Patent and Trademark Office*